United States Patent
Hagihara

(10) Patent No.: US 8,324,740 B2
(45) Date of Patent: Dec. 4, 2012

(54) SEMICONDUCTOR DEVICE, AND METHOD OF MANUFACTURING MULTILAYER WIRING BOARD AND SEMICONDUCTOR DEVICE

(75) Inventor: Kiyomi Hagihara, Osaka (JP)

(73) Assignee: Panasonic Corporation, Osaka (JP)

( * ) Notice: Subject to any disclaimer, the term of this patent is extended or adjusted under 35 U.S.C. 154(b) by 104 days.

(21) Appl. No.: 12/707,927

(22) Filed: Feb. 18, 2010

(65) Prior Publication Data

US 2010/0140800 A1 Jun. 10, 2010

Related U.S. Application Data

(63) Continuation of application No. PCT/JP2009/000719, filed on Feb. 19, 2009.

(30) Foreign Application Priority Data

Mar. 25, 2008 (JP) .................. 2008-077557
Jan. 7, 2009 (JP) .................. 2009-001253

(51) Int. Cl.
*H01L 23/48* (2006.01)
(52) U.S. Cl. ........ 257/786; 257/730; 257/778; 257/779; 257/E23.151
(58) Field of Classification Search .................. 257/678, 257/690, 692, 734, 774, 775, E23.011, E23.067; 438/629, 637, 640, 667, 672, 675
See application file for complete search history.

(56) References Cited

U.S. PATENT DOCUMENTS

| | | | | |
|---|---|---|---|---|
| 6,329,610 B1 * | 12/2001 | Takubo et al. | | 174/264 |
| 7,750,459 B2 * | 7/2010 | Dang et al. | | 257/691 |
| 2004/0026781 A1 | 2/2004 | Nakai | | |
| 2004/0160751 A1 | 8/2004 | Inagaki et al. | | |
| 2007/0075436 A1 | 4/2007 | Watanabe et al. | | |
| 2009/0065245 A1 * | 3/2009 | Hsu | | 174/260 |
| 2009/0267217 A1 * | 10/2009 | Kuwabara | | 257/692 |

FOREIGN PATENT DOCUMENTS

| | | |
|---|---|---|
| JP | 6-204288 A | 7/1994 |
| JP | 9-064095 A | 3/1997 |
| JP | 2001-135749 A | 5/2001 |
| JP | 2007-096198 A | 4/2007 |
| JP | 2007-242782 A | 9/2007 |
| WO | WO 2005/034231 A1 | 4/2005 |

* cited by examiner

*Primary Examiner* — Eduardo A Rodela
(74) *Attorney, Agent, or Firm* — Hamre, Schumann, Mueller & Larson, P.C.

(57) ABSTRACT

A semiconductor device includes a multilayer wiring board and a semiconductor chip mounted on the multilayer wiring board. Electrode pads of the semiconductor chip include: first electrode pads including electrode pads respectively disposed in the vicinity of corners of the back surface of the semiconductor chip; and second electrode pads other than the first electrode pads. Connection pads of the multilayer wiring board include: first connection pads connected to the first electrode pads via bumps; and second connection pads connected to the second electrode pads via bumps. The first connection pads are supported by a first insulating region made of a thermoplastic resin, and the second connection pads are supported by a second insulating region made of a thermosetting resin.

14 Claims, 11 Drawing Sheets

SEMICONDUCTOR DEVICE, AND METHOD OF MANUFACTURING MULTILAYER WIRING BOARD AND SEMICONDUCTOR DEVICE

BACKGROUND OF THE INVENTION

1. Field of the Invention

The present invention relates to a semiconductor device including a multilayer wiring board and a semiconductor chip mounted on the multilayer wiring board, and to a method of manufacturing the multilayer wiring board and the semiconductor device.

2. Related Background Art

In recent years, with the demand for higher performance and smaller size of electronic devices, higher-density integration of electronic components and even higher-density packaging thereof have been developed. Semiconductor devices (semiconductor packages) used for such electronic devices have been miniaturized and the pin counts thereof have increased more than ever before.

Conventional semiconductor packages using lead frames are approaching their limits of miniaturization. In order to achieve the higher-density integration and higher-density packaging of semiconductor devices, they are fabricated using chip mounting techniques such as wire bonding, tape automated bonding (TAB), and flip chip bonding. Among these mounting techniques, the flip chip bonding allows the semiconductor devices to be packaged with the highest density while reducing the size thereof, and thus is applied widely to semiconductor devices used in computer devices, advanced mobile devices, and so forth.

In the flip chip bonding, a semiconductor chip is mounted on a multilayer wiring board. Specifically, electrode terminals (electrode pads, for practical purposes) are formed previously on the back surface of the semiconductor chip, and connection pads each corresponding to the electrode pad are provided on the multilayer wiring board. Then, the electrode pads and the connection pads are connected by using electrically conductive bumps (see, for example, JP 2001-135749 A). The electrically conductive bumps can be made of an electrically conductive metal such as gold and solder, but solder is often used because of its advantages such as easiness in mounting and stress relaxation in bonding portions. The solder bumps can be formed by techniques such as a ball mounting method, a paste printing method, and a plating method.

Since the flip chip bonding is a surface mounting technique, a large number of electrical connections can be made in a small area, but a finer pitch is required for connection pads as semiconductor devices are miniaturized and the pin counts thereof increase. As the pitch of the connection pads becomes finer, the height of the solder bumps also tends to be reduced. In the future, semiconductor devices having such a fine pitch connection pattern (in particular, a connection pad pitch of 200 µm or less) will become mainstream.

As a commonly-used technique for forming solder bumps, a paste printing method has been used widely in view of productivity and cost. This method has, however, the following problem. A fine pitch of solder bumps may cause short circuits between adjacent bumps during printing of the solder paste, which results in a significant decrease in the yield. Therefore, more desirable methods for forming solder bumps at a fine pitch are: a plating method for forming solder bumps by electrolytic plating; and a ball mounting method for forming solder bumps by placing solder balls on pads and reflowing them.

As multilayer wiring boards used for the flip chip bonding, build-up boards manufactured by a build-up method commonly are used in view of higher wiring density, reduction in weight, thickness, and even cost. A build-up board is a multilayer wiring board in which on a glass epoxy substrate (core substrate) obtained by impregnating a glass cloth with glass epoxy resin, circuit pattern layers and insulating layers are formed alternately, and on the top surface of these laminated layers, connection pads for establishing an electrical connection with a semiconductor chip are formed. A thermosetting insulating resin is used for the formation of the insulating layers.

However, there is a significant difference in thermal expansion coefficients between the semiconductor chip and the multilayer wiring board. Therefore, if the semiconductor chip and the multilayer wiring board are subjected to a significant temperature change during or after the flip chip bonding, a stress is concentrated on the solder bumps serving as connecting members between the semiconductor chip and the multilayer wiring board, which may cause cracks in the solder bumps or in the vicinity thereof and result in a poor connection.

For this reason, in order to ensure the connection reliability, there has been a technique employed for encapsulating solder bumps by pouring an insulating resin called an underfill into the clearance gap between the semiconductor chip and the multilayer wiring board so as to fill the clearance gap with the resin and then curing the resin, after the flip chip bonding. However, as described above, the size of solder bumps become narrower and narrower as semiconductor devices are miniaturized and the pin counts thereof increase, and accordingly a larger stress is applied on the solder bumps. As a result, a concern arises that cracks cannot be prevented only by the protection of encapsulating the solder bumps with resin.

As a countermeasure against this problem, it is conceivable that the volumes of only the solder bumps located on the four corners, on which stress is particularly concentrated, are increased so as to increase the cross-sectional areas thereof, as described in JP 2007-242782 A, for example.

However, the ball mounting method, in which solder balls of the same size are mounted on pads, is not adequate to increase the volumes of only some of the solder bumps. JP 2007-242782 A describes that a paste printing method or a paste dispensing method is suitable for realizing this concept, but these methods are not adequate to form solder bumps at a fine pitch, as described above. Thus, it is desired to prevent cracks from occurring while maintaining the volumes of all the solder bumps at the same level.

SUMMARY OF THE INVENTION

The present invention has been made in view of the above circumstances, and it is an object of the present invention to provide a semiconductor device capable of preventing cracks from occurring while maintaining the volumes of all the bumps at the same level even if the pitch of the connection pads is 200 µm or less. It is also an object to provide a method of manufacturing the semiconductor device and a multilayer wiring board used for the semiconductor device.

In order to achieve the above objects, the present invention provides a semiconductor device including: a semiconductor chip having electrode pads formed on its back surface; and a multilayer wiring board having connection pads formed on its front surface, each of which faces the corresponding electrode pad. In this semiconductor device, the electrode pads include: first electrode pads including electrode pads respectively disposed in the vicinity of corners of the back surface of the semiconductor chip; and second electrode pads other than the first electrode pads. The connection pads include: first connection pads connected to the first electrode pads via bumps; and second connection pads connected to the second electrode pads via bumps. The multilayer wiring board includes: a first insulating region for supporting the first connection pads; and a second insulating region for supporting the second connection pads, and the first insulating region is made of a thermoplastic resin and the second insulating region is made of a thermosetting resin.

Here, the first electrode pads mean, among the electrode pads, those located relatively far from the center of the back surface of the semiconductor chip. The second electrode pads mean, among the electrode pads, those concentrated as a group of consecutive electrode pads in the center of the back surface of the semiconductor chip.

In another aspect, the present invention provides a semiconductor device including: a semiconductor chip having electrode pads formed on its back surface; and a multilayer wiring board having connection pads formed on its front surface, each of which faces the corresponding electrode pad. In this semiconductor device, the electrode pads include: first electrode pads including electrode pads respectively disposed in the vicinity of corners of the back surface of the semiconductor chip; and second electrode pads other than the first electrode pads. The connection pads include: first connection pads connected to the first electrode pads via bumps; and second connection pads connected to the second electrode pads via bumps. The multilayer wiring board includes: a first insulating layer constituting a first insulating region for supporting the first connection pads; and a second insulating layer constituting a second insulating region for supporting the second connection pads, and the first insulating layer is stacked on the second insulating layer.

The present invention also provides a multilayer wiring board having a front surface on which a semiconductor chip is to be mounted. This multilayer wiring board includes: a plurality of pads arranged in a rectangular region on the front surface; a first insulating layer constituting a first insulating region for supporting at least pads located at four corners among the plurality of pads; and a second insulating layer constituting a second insulating region for supporting pads other than the pads supported by the first insulating layer among the plurality of pads. The first insulating layer is made of a thermoplastic resin and the second insulating layer is made of a thermosetting resin, and the first insulating layer is stacked on the second insulating layer.

The present invention further provides a method of manufacturing a multilayer wiring board. This method includes the steps of forming a circuit pattern on a core substrate containing glass cloth; forming a lower insulating layer of a thermosetting resin on the core substrate on which the circuit pattern is formed; forming, on the lower insulating layer, a circuit pattern and a plurality of pads connected electrically to the circuit pattern formed on the core substrate; forming, on the lower insulating layer on which the circuit pattern is formed, an upper insulating layer of a thermoplastic resin in such a manner that the upper insulating layer surrounds the pads as a group; and forming, on the upper insulating layer, a plurality of pads connected electrically to the circuit pattern formed on the lower insulating layer.

The present invention also provides a method of manufacturing a semiconductor device. This method includes the steps of: preparing a multilayer wiring board obtained by the above-mentioned method of manufacturing a multilayer wiring board and a semiconductor chip having electrode pads formed on its back surface; forming solder bumps by placing solder balls on the electrode pads and reflowing the solder balls; and mounting the semiconductor chip on a front surface of the multilayer wiring board by placing the semiconductor chip on the front surface of the multilayer wiring board in such a manner that the connection pads and the corresponding electrode pads face each other across the solder bumps and reflowing the solder bumps while maintaining the placing.

According to the first structure as described above, the first connection pads, which are connected to the bumps located at positions on which the stress generated by a temperature change is particularly concentrated, are supported by the first insulating region made of a thermoplastic resin. Therefore, when the surrounding environment temperature is high, the first insulating region is softened. This softening of the first insulating region can relax the stress applied to the bumps connected to the first connection pads. Accordingly, even when the bumps having approximately the same volume are used, cracks effectively can be prevented from occurring. Moreover, the second connection pads connected to the other bumps are supported by the second insulating region made of a thermosetting resin. Therefore, even when the surrounding environment temperature is high, the second connection pads are maintained in fixed positions. For these reasons, the above-mentioned advantageous effects can be obtained while maintaining the bonding strength between the multilayer wiring board and the semiconductor chip.

According to the second structure as described above, the first insulating layer for supporting the first connection pads, which are connected to the bumps located at positions on which the stress generated by a temperature change is particularly concentrated, is stacked on the second insulating layer for supporting the second connection pads connected to the bumps located at other positions. That is, a level difference is formed between the first connection pads and the second connection pads, and the first connection pads are located closer to the semiconductor chip than the second connection pads. Therefore, even if all the bumps have approximately the same volume, the bumps connected to the first connection pads can be formed into a more pressed and spread-out shape than the bumps connected to the second connection pads. As a result, the enlarged cross-sectional areas of the bumps connected to the first connection pads allow the stress applied to these bumps to be reduced. Accordingly, even if the bumps having approximately the same volume are used, cracks effectively can be prevented from occurring.

As described above, according to the present invention, it is possible to prevent occurrence of cracks caused by temperature changes, and thus to obtain a high reliability of connection between the semiconductor chip and the multilayer wiring board.

DETAILED DESCRIPTION OF THE INVENTION

Hereafter, an embodiment of the present invention will be described with reference to the accompanying drawings. It should be noted, however, that the embodiment described below is merely an example of the best mode for carrying out the present invention, and should not be construed to limit the scope of the present invention.

Figure 1:
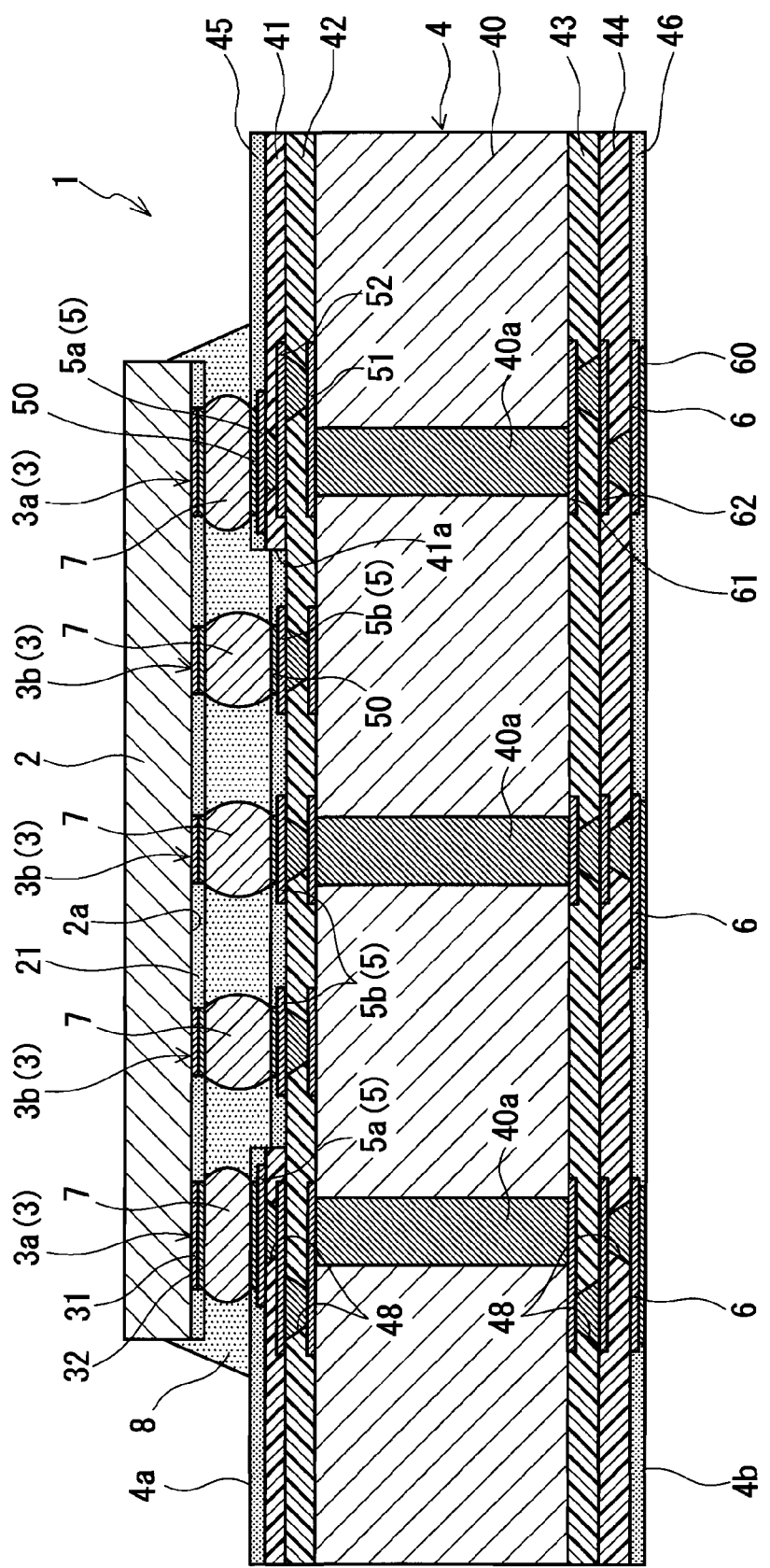
FIG. 1 is a cross-sectional view of a semiconductor device according to one embodiment of the present invention.
Figure 2:
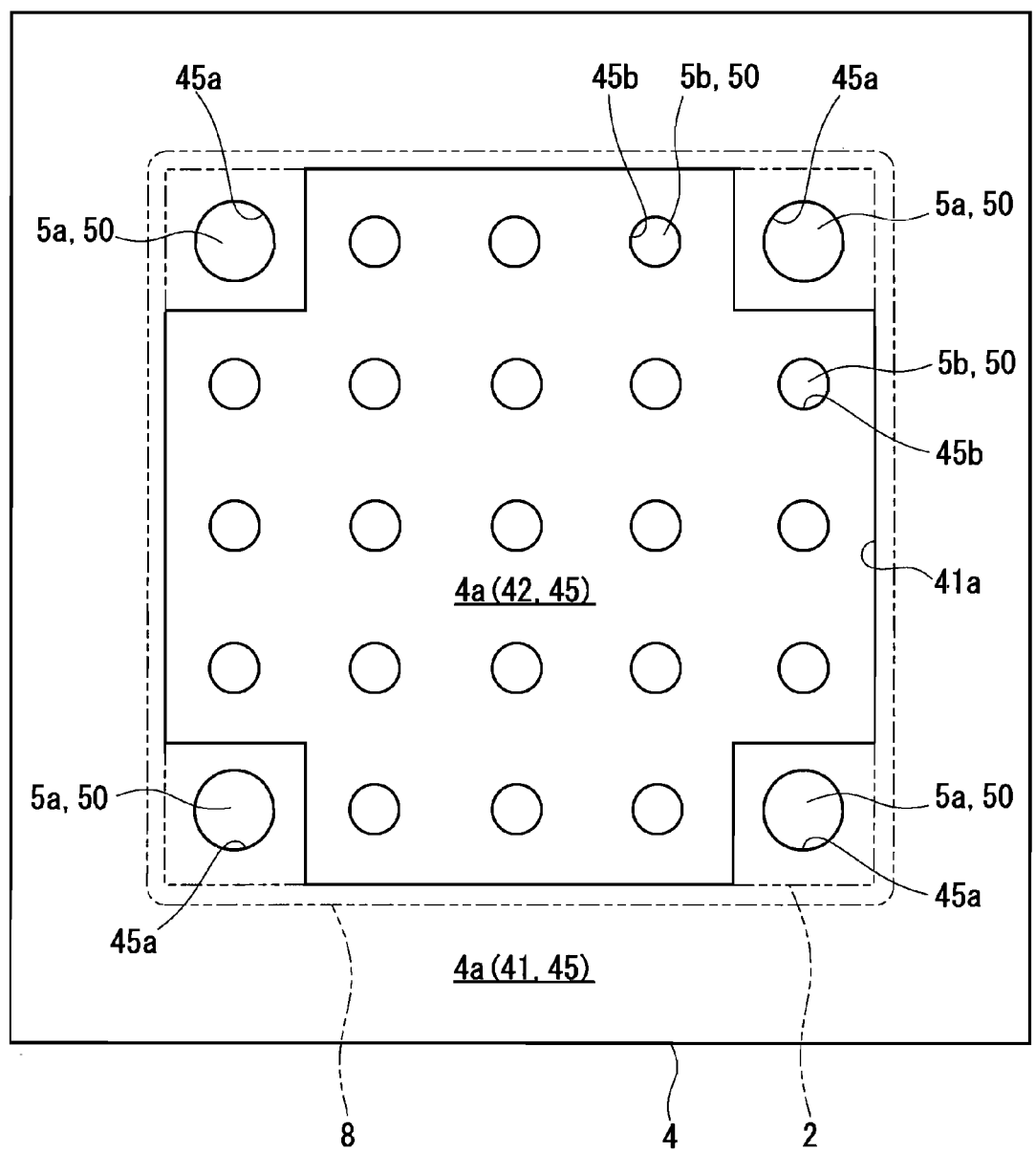
FIG. 2 is a plan view of the semiconductor device shown in FIG. 1.

As shown in FIG. 1 and FIG. 2, a semiconductor chip 1 according to one embodiment of the present invention includes a multilayer wiring board 4 and a semiconductor chip 2 mounted on a front surface 4a of the multilayer wiring board 4. In FIG. 2, the semiconductor chip 2 and an underfill 8 to be described later are shown by chain double-dashed lines.

The semiconductor chip 2 has a flat rectangular plate shape. On a back surface 2a of the semiconductor chip 2, a plurality of electrode pads 3 are formed (for example, 1000 to 2000 electrode pads are formed, but for simplification, it is assumed in the diagrams that 25 electrode pads are formed). These electrode pads 3 may be arranged in a matrix manner, or may be arranged in a staggered manner.

Each of the electrode pads 3 is, for example, circular, and includes an aluminum pad 31 and an under bump metal (UBM) layer 32 formed thereon. The UBM layer 32 is formed by forming an electroless nickel plated layer with a thickness of 10 μm on the aluminum pad 31 and further forming a gold plated layer with a thickness of 0.1 μm thereon. A region other than the electrode pads 3 on the back surface 2a of the semiconductor chip 2 is covered with an insulating protective film 21 composed of, for example, a polyimide resin.

More specifically, the electrode pads 3 include: first electrode pads 3a respectively disposed in the vicinity of the corners (four vertices) of the back surface 2a of the semiconductor chip 2; and second electrode pads 3b other than the first electrode pads 3a. It is preferable that the first electrode pads 3a are larger in size than the second electrode pads 3b. For example, the diameters of each of the first electrode pads 3a and each of the second electrode pads 3b may be 140 μm and 100 μm, respectively.

A multilayer wiring board 4 is an interposer including a core substrate 40 and a multilayer structure formed by stacking circuit patterns and insulating layers alternately on both the front and back surfaces of the core substrate 40. On the front surface 4a of the multilayer wiring board 4, a plurality of connection pads 5, each of which faces the corresponding electrode pad 3, are formed. On the back surface 4b thereof, a plurality of external connection pads 6, each of which is connected electrically to the corresponding connection pad 5, are formed.

Specifically, on the front surface of the core substrate 40, a circuit pattern 51, a second insulating layer (lower insulating layer) 42, a circuit pattern 52, and a first insulating layer (upper insulating layer) 41 are stacked in this order. On the back surface of the core substrate 40, a circuit pattern 61, a third insulating layer 43, a circuit pattern 62, and a fourth insulating layer 44 are stacked in this order. The first insulating layer 41 has an opening 41a for exposing the second insulating layer 42 so that the second insulating layer 42 faces the back surface 2a of the semiconductor chip 2. The connection pads 5 are supported by the first insulating layer 41 and the second insulating layer 42, and the external connection pads 6 are supported by the fourth insulating layer 44. The first insulating layer 41 constitutes a first insulating region for supporting first connection pads 5a to be described later, and the second insulating layer 42 constitutes a second insulating region for supporting second connection pads 5b to be described later.

In the present embodiment, the opening 41a is formed in a cross shape. That is, the first insulating layer 41 is formed in such a manner that, with the opening 41a, it faces only the four corner portions of the back surface 2a of the semiconductor chip 2. On the other hand, the second insulating layer 42 faces a region other than the four corner portions of the back surface 2a of the semiconductor chip 2 through the opening 41a.

In the respective insulating layers 41 to 44, via holes 48 are formed for connecting electrically the pads 5 (or 6) and the circuit patterns 51, 52 (or 62) respectively, or the circuit patterns 51 and 52 (or 61 and 62), through the insulating layers 41 to 44. In the core substrate 40, through electrodes 40a are formed for connecting electrically the circuit patterns 51 and 61 through the core substrate 40.

The multilayer wiring board 4 further includes a front-side solder resist 45 covering the first insulating layer 41 and the second insulating layer 42, and a back-side solder resist 46 covering the fourth insulating layer 44. The exposed surface of the front-side solder resist 45 constitutes the front surface 4a of the multilayer wiring board 4, and the exposed surface of the back-side solder resist 46 constitutes the back surface 4b of the multilayer wiring board 4.

As the core substrate 40, a substrate made of ceramic or an organic material can be used. However, it is preferable to use a glass epoxy substrate obtained by impregnating a glass cloth with a thermosetting resin because of its cost and because such a glass epoxy substrate can relax effectively the stress applied to the bonding portions when it is subjected to thermal stress. The thickness of the core substrate 40 is, for example, 0.4 mm. An epoxy resin can be used suitably as the thermosetting resin constituting the core substrate 40, but other resins also may be used. For example, one of high heat-resistant thermosetting resins such as a bismaleimide triazine resin or a thermosetting polyphenylene ether resin may be used, or a mixture of two or more of these resins also may be used.

Each of the connection pads 5 is connected to the corresponding electrode pad 3 of the semiconductor chip 2 via the solder bump 7. All the solder bumps 7 have approximately the same volume (for example, $5.0 \times 10^{-4}$ mm$^3$).

More specifically, the connection pads 5 include first connection pads 5a connected to the first electrode pads 3a, and second connection pads 5b connected to the second electrode pads 3b. The first connection pads 5a are supported by the first insulating layer 41, and the second connection pads 5b are supported by the second insulating layer 42. In other words, among the connection pads 5 arranged in a rectangular region on the front surface 4a of the multilayer wiring board 4, the first connection pads 5a located at the four corners are supported by the first insulating layer 41, and the second connection pads 5b other than the first connection pads 5a are supported by the second insulating layer 42. Thereby, a level difference equal to the thickness of the first insulating layer 41 is formed between the first connection pads 5a and the second connection pads 5b, and therefore, the first connection pads 5a are located closer to the semiconductor chip 2 than the second connection pads 5b by the level difference.

There is no particular limitation on the shape of the first connection pads 5*a* and the second connection pads 5*b*, and they may be circular or rectangular, for example. However, it is preferable that the first connection pads 5*a* are larger in size than the second connection pads 5*b*. For example, the first connection pads 5*a* and the second connection pads 5*b* may have a circular shape having diameters of 140 µm and 100 µm, respectively.

Preferably, the first insulating layer 41 is made of a thermoplastic resin. Any types of thermoplastic resins may be used for the first insulating layer 41, but in view of the method of manufacturing the multilayer wiring board, adhesion to the multilayer wiring board, and workability thereof, high heat resistant resins, commonly called "super engineering plastics", can be used suitably. Examples of such resins include polyphenylene ether (PPE), liquid crystal polymer (LCP), polyether ether ketone (PEEK), polyetherimide (PEI), polyethersulfone (PES), and thermoplastic polyimide (PI).

More preferably, the thermoplastic resin constituting the first insulating layer 41 has a melting point of 280° C. or higher. This is because, since the reflow treatment in the flip chip bonding process is carried out in a higher temperature atmosphere (260° C., for example) than the melting point of the solder bumps 7 (217° C., for example, in the case of solder bumps having a composition of 97.5 wt % of tin and 2.5 wt % of silver), the first insulating layer 41 must not be melted in such a high temperature atmosphere.

It is preferable that the thickness of the first insulating layer 41 is at least 1.5 times the thickness of the circuit pattern 52 formed immediately beneath the first insulating layer 41 in the multilayer wiring board. Since the circuit pattern 52 is embedded in the first insulating layer 41, circuit patterns cannot be formed on and beneath the first insulating layer 41 if the first insulating layer 41 is thinner than the circuit pattern 52. Furthermore, when the thickness of the first insulating layer 41 is less than 1.5 times the thickness of the circuit pattern 52, voids penetrating the first insulating layer 41 vertically are formed by a treatment such as etching during a circuit pattern formation process or a surface roughening treatment during an insulating layer formation process, and through these voids, the circuits on and beneath the first insulating layer 41 may be short-circuited even though they must not be connected electrically to each other. Furthermore, it is preferable that the thickness of the first insulating layer 41 is not more than one-half of the height of the solder bumps 7 formed between the second electrode pads 3*b* and the second connection pads 5*b*. When the thickness of the first insulating layer 41 exceeds one-half of the height of the solder bumps 7 formed between the second electrode pads 3*b* and the second connection pads 5*b*, a level difference between the first connation pads 5*a* and the second connection pads 5*b* becomes excessively large, and thus the solder bumps 7 to be connected to the first connection pads 5*a* are pressed strongly. As a result, the connection reliability may be degraded. For example, the thickness of the first insulating layer 41 may be 5 µm to 50 µm.

It is preferable that the second, third, and fourth insulating layers 42 to 44 are made of a thermosetting resin containing an inorganic filler. The inorganic filler is added to reduce the thermal expansion coefficient and improve the elastic coefficient of the respective insulating layers while maintaining the insulating properties thereof. The amount of the inorganic filler to be added is 10 to 60% by volume, for example. One example of the inorganic filler is spherical silica particles having an average particle diameter of 5 µm. Spherical or crushed fillers made not only of silica but also of alumina, aluminum hydroxide, barium titanate, etc. may be used.

As a thermosetting resin, an epoxy resin is used suitably, but other resins can be used. For example, one of high heat-resistant thermosetting resins such as a bismaleimide triazine resin and a thermosetting polyphenylene ether resin may be used, or a mixture of two or more of these resins also may be used.

On the front-side solder resist 45, openings 45*a* and 45*b* (see FIG. 2) for exposing the first connection pads 5*a* and the second connection pads 5*b* therethrough are formed at positions corresponding to the first connection pads 5*a* and the second connection pads 5*b*, respectively. It is preferable that the openings 45*a* formed at the positions corresponding to the first connection pads 5*a* are larger in size than the openings 45*b* formed at the positions corresponding to the second connection pads 5*b*. This is because, in the present embodiment, since the solder bumps 7 to be connected to the first connection pads 5*a* when the semiconductor chip 2 is mounted on the multilayer wiring board 4 are pressed strongly due to the above-mentioned level difference between the first connection pads 5*a* and the second connection pads 5*b*, a larger contact area can be secured between the first connection pads 5*a* and the strongly pressed and spread-out solder bumps 7. Thereby, the durability of the bonding portions between them is improved. For example, the diameter of the openings 45*a* and the diameter of the openings 45*b* may be 130 µm and 90 µm, respectively. The size of the openings 45*a* formed at the positions corresponding to the first connection pads 5*a* may be determined according to the thickness of the first insulating layer 41 and the volume of each of the solder bumps 7. The thickness of the front-side solder resist layer 45 is 20 µm, for example.

On the first connection pads 5*a* and the second connection pads 5*b* exposed through the openings 45*a* and 45*b*, a barrier metal layer 50 is formed. The barrier metal layer 50 can be formed by, for example, forming an electroless nickel plated layer with a thickness of 10 µm on the first connection pads 5*a* and the second connection pads 5*b* and further forming a gold plated layer with a thickness of 0.1 µm thereon. The first connection pads 5*a* and the second connection pads 5*b* are connected to the solder bumps 7 via the barrier metal layer 50.

The back-side solder resist 46 also has openings formed at positions corresponding to the external connection pads 6, and a barrier metal layer 60 is formed in these openings.

Furthermore, in the semiconductor device 1 of the present embodiment, an underfill 8 is filled between the multilayer wiring board 4 and the semiconductor chip 2. As the underfill 8, for example, a polyfunctional epoxy resin is commonly used in view of heat resistance. In particular, insulating resins such as a bisphenol-A novolac epoxy resin, a bisphenol-F novolac epoxy resin, and a cresol novolac epoxy resin can be used.

In the semiconductor device 1 as described above, the solder bumps 7 located at the four corners, to which the strongest stress is applied when the semiconductor chip 2 and the multilayer wiring board 4 are joined to each other via the solder bumps 7, are connected to the first connection pads 5*a* formed on the first insulating layer 41 made of a thermoplastic resin. When the thermal stress is applied, the first insulating layer 41 made of a thermoplastic resin is softened, and thereby the stress applied particularly intensively to the solder bumps 7 located at the four corners can be relaxed. Moreover, since all the other solder bumps 7 are connected to the second connection pads 5*b* formed on the second insulating layer 42 having a high elastic coefficient even when a heat load is applied thereto, the stiff and solid joint between the semiconductor chip 2 and the multilayer wiring board 4 can be secured as a whole. Furthermore, since the level difference between the first connection pads 5a and the second connection pads 5b allows each of the solder bumps 7 located at the four corners to enlarge its cross-sectional area significantly, the stress applied to these solder bumps 7 can be reduced more. For these reasons, even if the solder bumps having approximately the same volume are used as in the present embodiment, it is possible not only to prevent the occurrence of cracks effectively, but also to obtain a semiconductor device having a high bonding strength between the semiconductor chip 2 and the multilayer wiring board 4.

In addition, if the solder bumps 7 having approximately the same volume are used as in the present embodiment, the solder bumps 7 can be formed by the ball mounting method. Therefore, the solder bumps 7 can be formed satisfactorily even in the case of a narrow connection pad pitch of 200 μm or less.

Next, a method of manufacturing the semiconductor device 1 will be described.

1) Manufacture of Multilayer Wiring Board

The multilayer wiring board 4 is manufactured in the following manner. A build-up method, which is commonly called a sequential build-up method, is used in the processes for manufacturing the second, third, and fourth insulating layers 42 to 44 so as to form the insulating layers and the circuit patterns in order on the core substrate 40 containing glass cloth. A specific manufacturing method of the multilayer wiring board 4 will be described below with reference to FIGS. 3 to 5.

Figure 3:
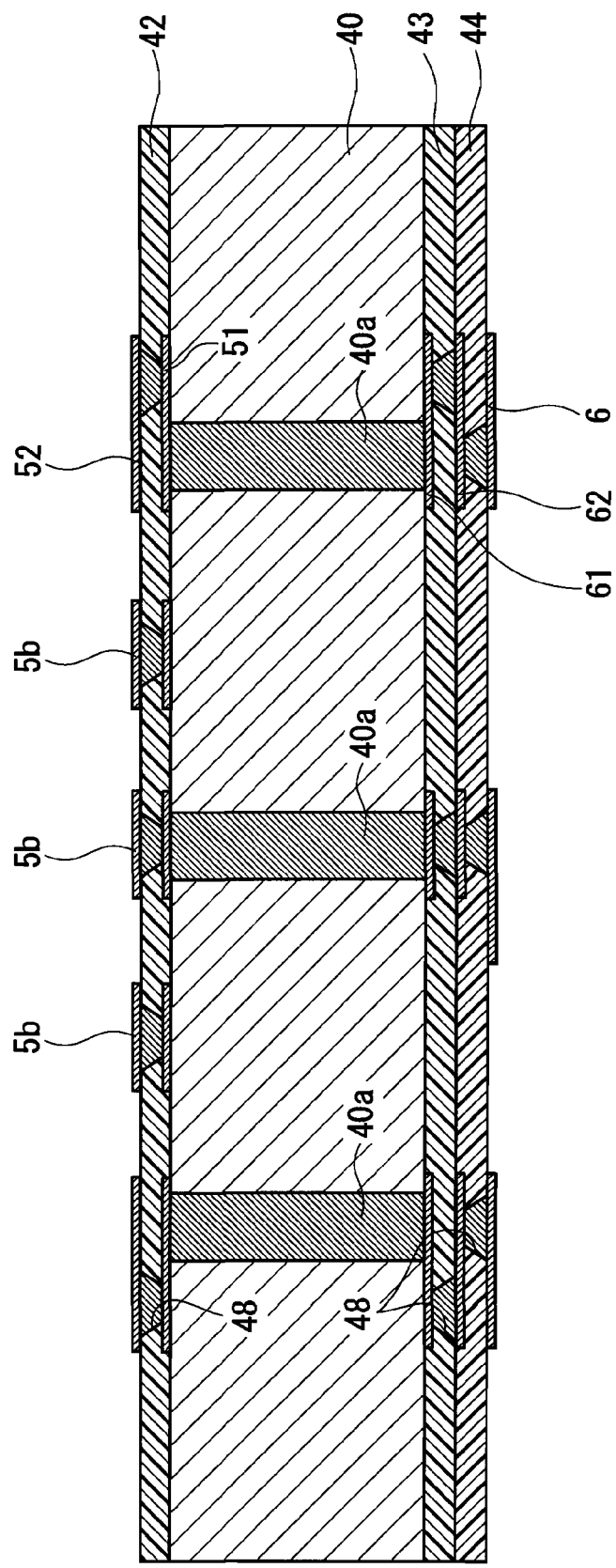
FIG. 3 is a diagram for explaining a method of manufacturing a multilayer wiring board.

FIG. 3 is a cross-sectional view showing a state before forming the first insulating layer 41. First, metal foils with a thickness of 15 μm, for example, are bonded to both the front and back surfaces of the core substrate 40 by thermocompression bonding. As such a metal foil, a copper foil formed by electrolytic plating can be used. Next, in order to connect the metal foils on the front and back surfaces electrically to each other, through holes penetrating the core substrate 40 and the metal foils together are formed using a carbon dioxide gas laser. Subsequently, the through holes are filled with electroless copper plating and electrolytic copper plating. Thus, through electrodes 40a are formed. After that, the metal foils are etched, and thus the circuit patterns 51, 61 are formed on the core substrate 40.

Next, a film, which is obtained by molding previously a thermosetting resin containing an inorganic filler as described above, is bonded, by thermocompression bonding, to the front surface of the core substrate 40 on which the circuit pattern 51 has been formed, and cured. Thus, the second insulating layer 42 is formed. The method for forming the second insulating layer 42 is not limited to the method as described above. The second insulating layer 42 may be formed, for example, by applying uncured liquid thermosetting resin containing an inorganic filler by a screen printing method or a spin coating method and then curing the resin by heating.

Next, closed-end via holes 48 are formed in the second insulating layer 42 using a carbon gas laser in such a manner that the via holes 48 penetrate the second insulating layer 42 in the thickness direction thereof and reach the circuit pattern 51 formed therebeneath. The closed-end via holes 48 may be formed using not only a carbon gas laser but also other laser beam machines such as a third harmonic Nd-YAG laser and an excimer laser for emitting deep ultraviolet light having a shorter wavelength than 300 nm.

Next, the second insulating layer 42 is subjected to electroless copper plating and further to electrolytic copper plating. Thus, the closed-end via holes 48 are filled with a copper-plated film with a thickness of 15 μm, for example.

Subsequently, a photosensitive dry film resist is bonded to the surface of the copper-plated film using a thermocompression bonder, and a glass mask, on which a negative image having a desired conductor pattern is drawn, is aligned on the film. After that, exposure and development are carried out, and thus an etching resist is formed so that the copper-plated film is exposed except for the region where the necessary conductor pattern is formed. The region that is not covered with the etching resist is melted and removed by etching, and then the etching resist is peeled off. Thus, the second connection pads 5b and the circuit pattern 52 connected electrically to the circuit pattern 51 are formed on the second insulating layer 42.

After that, in the same manner as described above, the third insulating layer 43, the circuit pattern 62 connected electrically to the circuit pattern 61, the fourth insulating layer 44, and the external connection pads 6 connected electrically to the circuit pattern 62 are formed on the back surface of the core substrate 40.

Figure 4:
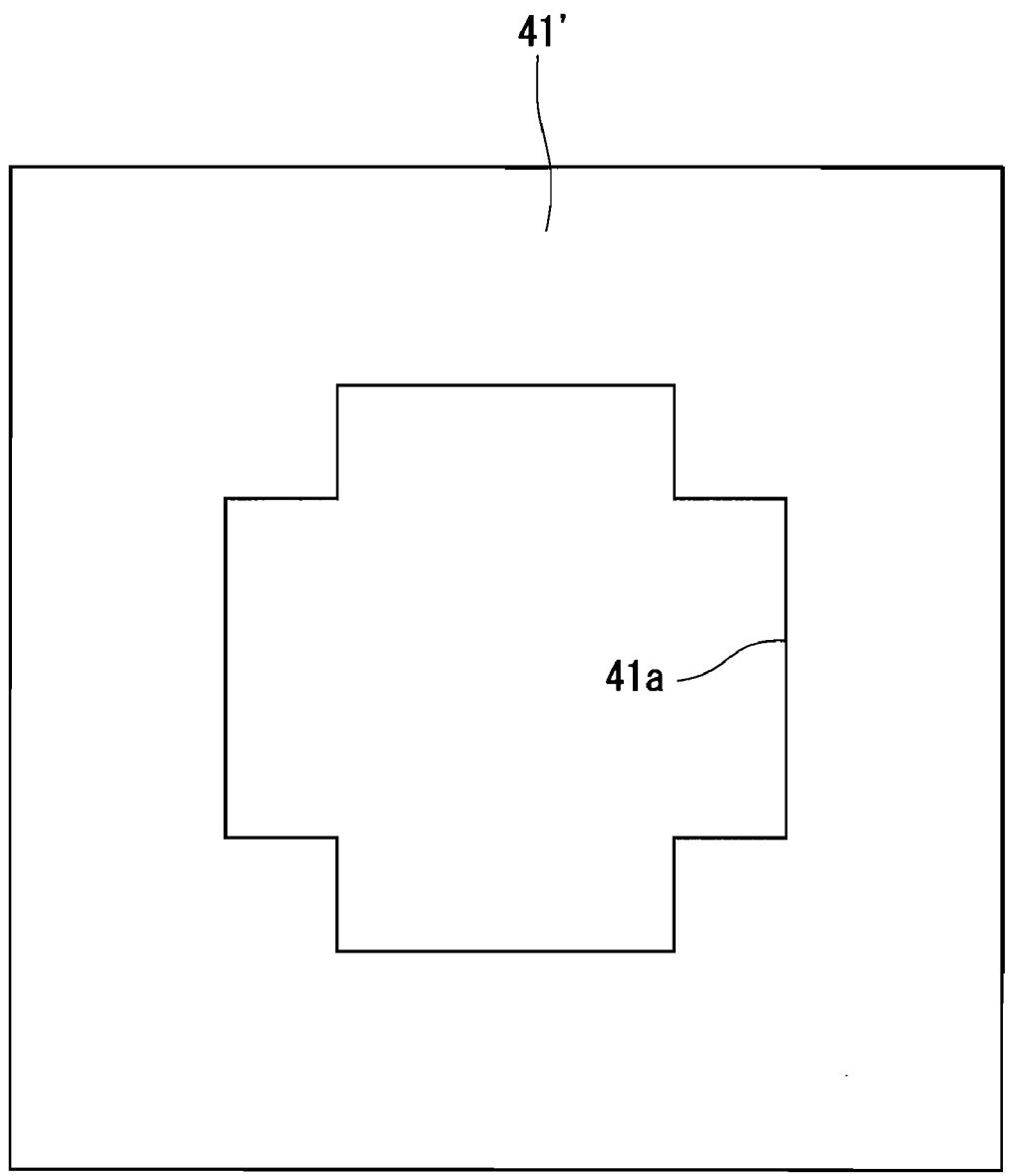
FIG. 4 is a plan view of a film for a first insulating layer.

Next, as shown in FIG. 4, a film 41' made of a thermoplastic resin as described above is prepared. This film has an opening 41a and thus can cover entirely a region other than the region in which the second connection pads 5b are arranged on the second insulating layer 42. The opening 41a can be formed by cutting out the region of the opening 41a from the film using a carbon gas laser, for example. This film 41' is aligned on the second insulating layer 42, and then bonded thereto by thermocompression bonding. Thus, the first insulating layer 41 is formed in such a manner that it surrounds the group of second connection pads 5b. The first insulating layer 41 also can be formed by applying a liquid thermoplastic resin to the second insulating layer 42. It is preferable, however, to use the film 41' in view of ease and cost in the manufacture of the multilayer wiring board. Next, in the same manner as in the formation of the second connection pads 5b on the second insulating layer 42, the first connection pads 5a are formed on the first insulating layer 41.

Next, in order to avoid short circuits between adjacent solder bumps 7 during the flip chip bonding, the front-side solder resist 45 having the openings 45a, 45b for exposing the first connection pads 5a and the second connection pads 5b therethrough is formed on the first insulating layer 41 and the second insulating layer 42 by an exposure process using a solder resist resin made of a photosensitive epoxy resin. There is a level difference between the first insulating layer 41 and the second insulating layer 42 serving as base layers for forming the front-side solder resist 45. Therefore, when the front-side solder resist 45 is formed, the portion thereof on the second insulating layer 42 is shaped first, and then the portion thereof on the first insulating layer 41 is shaped. Likewise, the back-side solder resist 46 having openings for exposing the external connection pads 6 is formed on the fourth insulating layer 44. Since there is no level difference on the back surface, the back-side solder resist 46 can be formed in a single process after the front-side solder resist 45 is formed. These solder resists 45, 46 are commonly formed by an exposure process for patterning using a photosensitive solder resist material. However, any method may be used to form the solder resists 45, 46 as long as they can be formed into a desired shape. They may be formed using laser beam machines such as a carbon gas laser, a third harmonic Nd-YAG laser, and an excimer laser for emitting deep ultraviolet light having a shorter wavelength than 300 nm.

Next, the barrier metal layers 50, 60 are formed on the first and second connection pads 5a, 5b and the external connection pads 6 in the regions exposed from the openings of the solder resists 45, 46.

Figure 5:
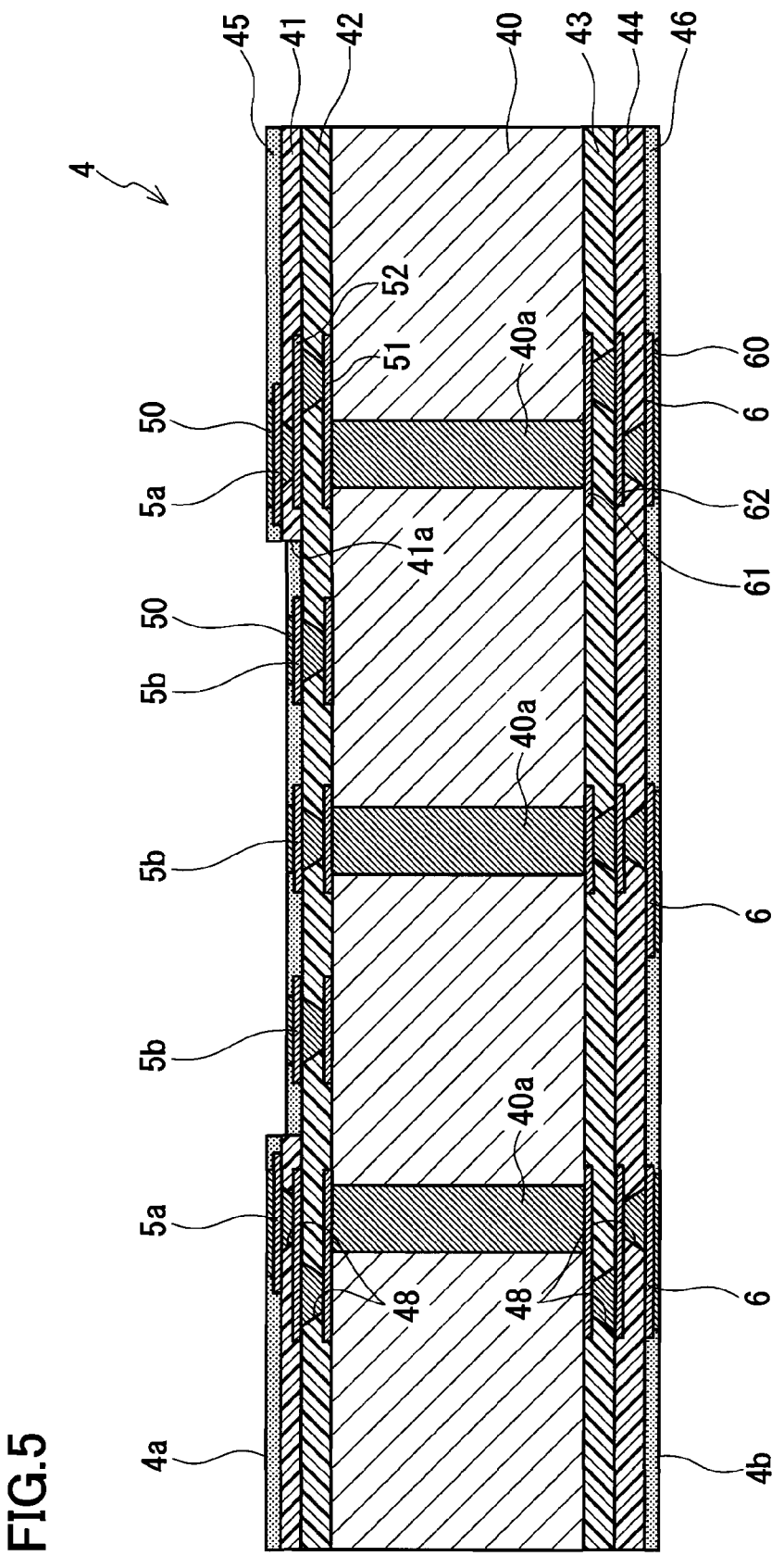
FIG. 5 is a cross-sectional view of a multilayer wiring board.

The multilayer wiring board 4 as shown in FIG. 5 can be manufactured by the above-mentioned processes.

2) Formation of Solder Bumps

Figure 6:
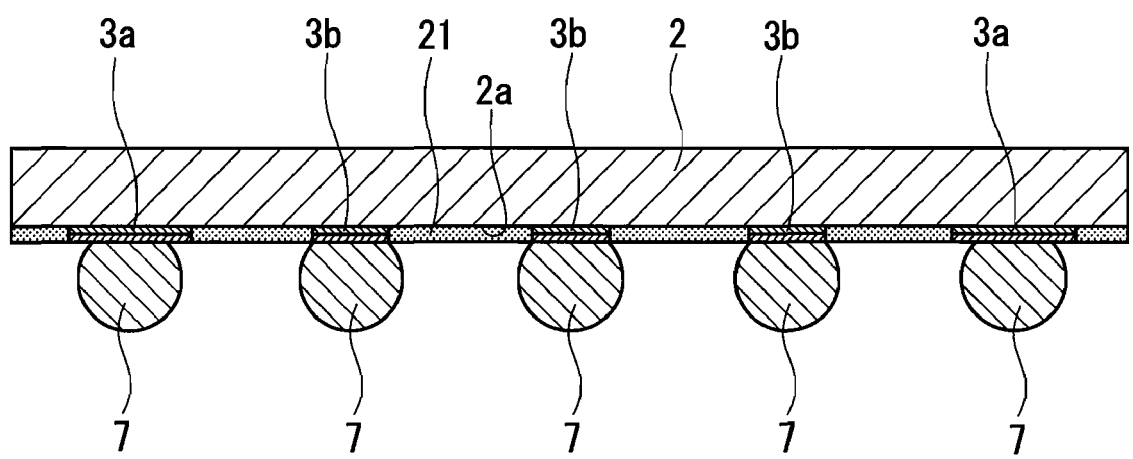
FIG. 6 is a cross-sectional view of a semiconductor chip in which bumps are formed on electrode pads.

As shown in FIG. 6, solder balls having a diameter of 100 μm are placed at predetermined positions on the first electrode pads 3a and the second electrode pads 3b of the semiconductor chip 2, and subjected to a reflow treatment in a nitrogen gas atmosphere. Thus, the solder bumps 7 are formed.

Figure 7:
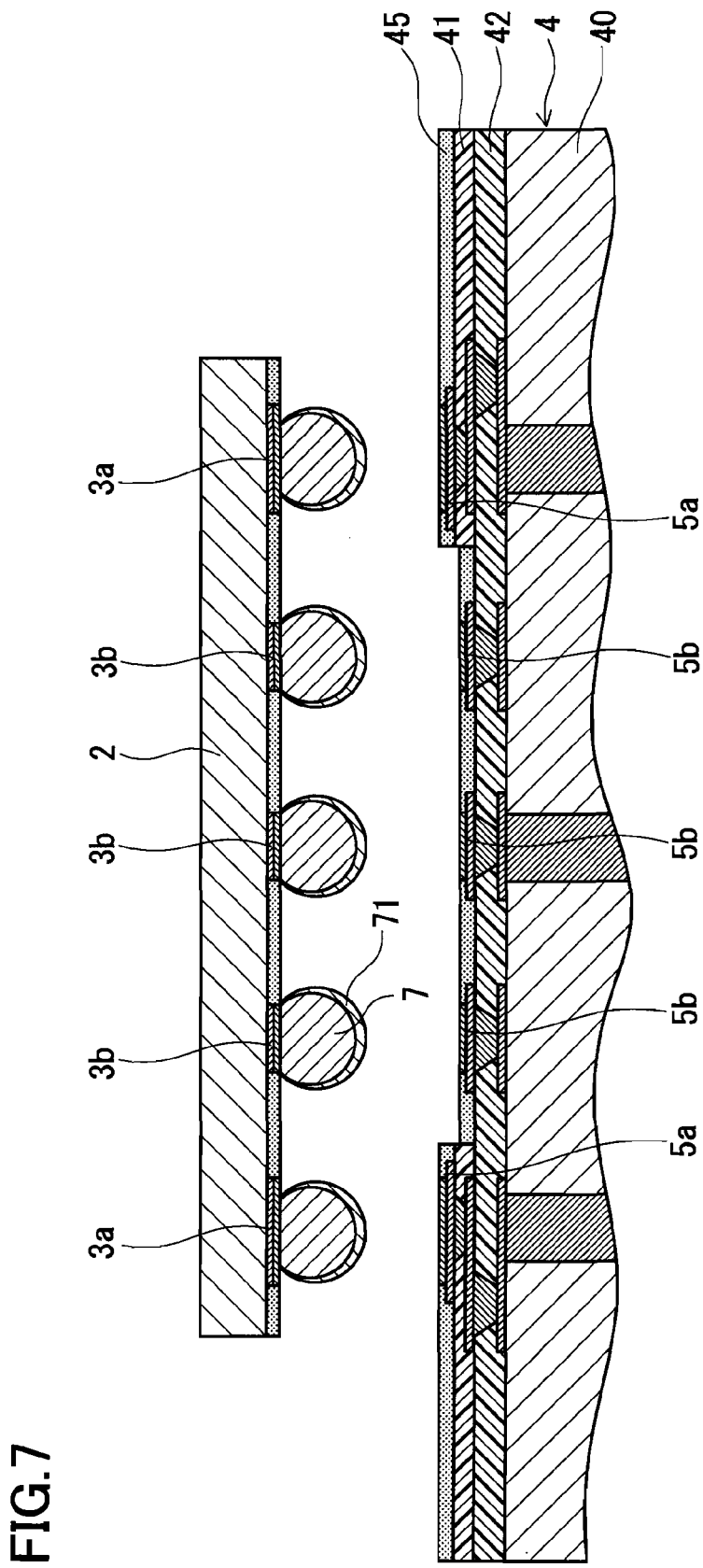
FIG. 7 is a diagram for explaining a method of manufacturing a semiconductor device.

Next, as shown in FIG. 7, a flux 71 is deposited on the solder bumps 7. Any method may be used for depositing the flux 71 on the solder bumps 7 as long as the flux 71 spreads itself over the entire surfaces of the solder bumps 7, but is not deposited on the insulating protective film 21 formed on the back surface 2a of the semiconductor chip 2. The flux 71 can be deposited on the solder bumps 7 by, for example, immersing the solder bumps 7 formed on the semiconductor chip 2 into the flux 71 applied to a flat surface evenly with a thickness (for example, 50 μm) smaller than the height of the solder bumps 7. By doing so, the wettability of the flux 71 for the solder allows the flux 71 to spread itself even to areas of the solder bumps 7 that have not been immersed in the flux 71, and thus to cover the surfaces of the solder bumps 7 evenly.

3) Mounting of Semiconductor Chip on Multilayer Wiring Board

As shown in FIG. 7, the multilayer wiring board 4 and the semiconductor chip 2 are aligned with each other in a predetermined positional relationship, and the semiconductor chip 2 is placed on the front surface 4a of the multilayer wiring board 4 in such a manner that the connection pads 5 and the electrode pads 3 face each other across the solder bumps 7. In this stage, the solder bumps 7 are merely in contact with the first connection pads 5a and the second connection pads 5b of the multilayer wiring board 4 via the flux 71 (to be precise, also via the barrier metal layer 50), and a soldered joint is not made therebetween.

Next, using a solder reflow apparatus, the multilayer wiring board 4 on which the semiconductor chip 2 is placed is heated (subjected to a reflow treatment) in a nitrogen atmosphere for 20 seconds or more at a temperature higher by 30° C. or more than the melting temperature of the solder bumps 7. Thus, as shown in FIG. 8, the semiconductor chip 2 is mounted on the front surface 4a of the multilayer wiring board 4 via the solder bumps 7.

Next, the residues of the flux 71 remaining around the solder bumps 7 are cleaned to remove them. In this flux cleaning process, a semiconductor-mounted body, as shown in FIG. 8, in which the semiconductor chip 2 is mounted on the multilayer wiring board 4, is completely immersed in a cleaning liquid, and subjected to an ultrasonic wave having a frequency of 100 kHz with an intensity of 100 W for 5 minutes. Then, shortly after the semiconductor-mounted body is taken out of the cleaning liquid, it is rinsed with pure water for 5 minutes. Since the ultrasonic treatment is carried out in the cleaning liquid as described above, the cleaning liquid permeates effectively into the clearance gap, in which the solder bumps 7 are provided, in the semiconductor-mounted body, and the residues in the semiconductor-mounted body can be removed relatively efficiently. A semiconductor chip was actually peeled off from a dummy sample and areas around the solder bumps 7 were observed. As a result of the observation, no flux residue was found around the solder bumps 7.

It is preferable to increase the intensity of the ultrasonic wave during the cleaning in order to enhance the cleaning effect. When the intensity of the ultrasonic wave is higher than 1000 W, the solder bumps 7 or the electrode pads 3 are cracked. On the other hand, when the intensity of the ultrasonic wave is lower than 50 W, flux residues cannot be removed at all. Therefore, the intensity of the ultrasonic wave is preferably at least 50 W but not more than 1000 W. Furthermore, when the frequency of the ultrasonic wave is higher than 600 kHz or lower than 50 kHz, the flux resides are not removed. Therefore, the frequency of the ultrasonic wave is preferably at least 50 kHz but not more than 600 kHz. There is no particular difference in removability of flux residues as long as both the cleaning time and the rinsing time exceed 1 minute. However, the multilayer wiring board 4 absorbs moisture during a long-term ultrasonic treatment, which may cause the multilayer wiring board 4 to swell or delaminate during the subsequent heat treatment process. For this reason, the cleaning time and the rinsing time are preferably 10 minutes or less.

Figure 8:
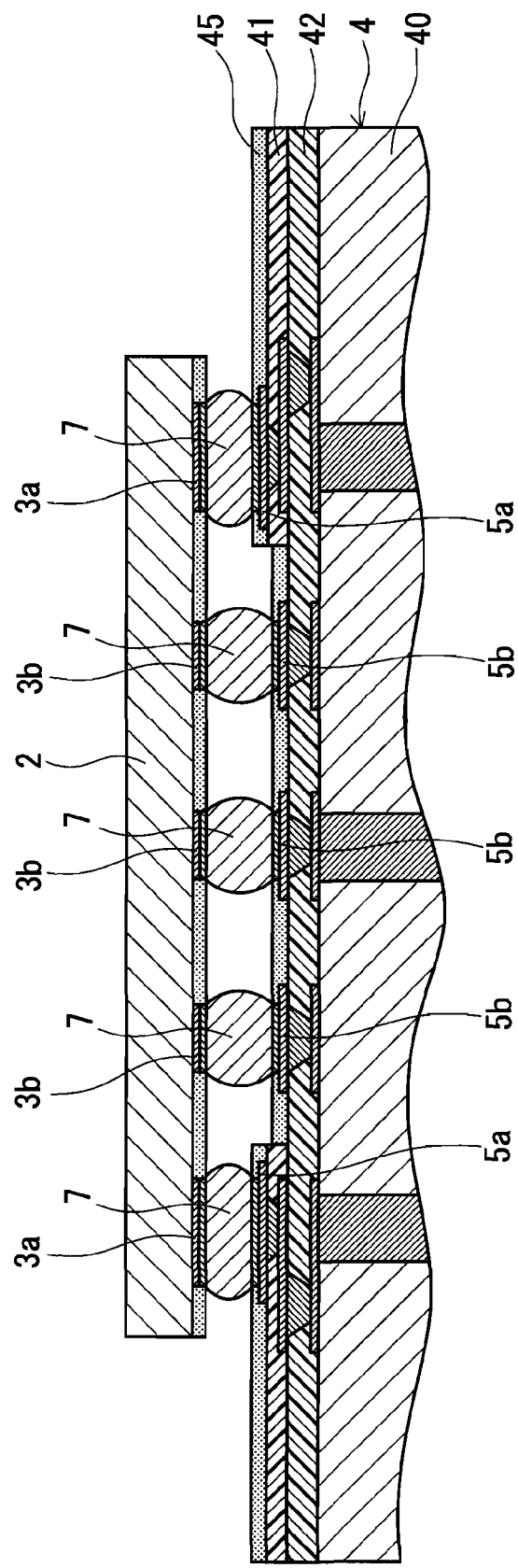
FIG. 8 is a diagram for explaining a method of manufacturing a semiconductor device.

Next, after the flux cleaning, the semiconductor-mounted body as shown in FIG. 8 is subjected to a baking treatment in a nitrogen atmosphere at a temperature of 115° C. to 125° C. for 1 hour, for example. When the baking time is shorter than 1 hour or when the baking temperature is lower than 115° C., water adsorbed on the front surface 4a of the multilayer wiring board 4 is not removed sufficiently. Therefore, the wettability of the underfill 8 for the surfaces of the solder resists 45, 46 is deteriorated during the subsequent underfill filling process, which may cause insufficient filling of the underfill 8. When the baking time is longer than 3 hours or when the baking temperature is higher than 125° C., the surfaces of the solder resists 45, 46 are discolored. For these reasons, the baking time is preferably at least 1 hour but not more than 3 hours, and the baking temperature is preferably at least 115° C. but not more than 125° C.

Next, the uncured underfill 8 is applied into the clearance gap between the multilayer wiring board 4 and the semiconductor chip 2 by an underfill applicator. A predetermined amount of the underfill 8 is applied along one of the longer sides of the four sides of the outline of the semiconductor chip 2. In order to increase the permeability of the underfill 8 into the clearance gap by lowering the viscosity thereof, it is preferable to apply the underfill 8 while maintaining the multilayer wiring board 4 on which the semiconductor chip 2 is mounted, as shown in FIG. 8, in a heated condition at a temperature of 65° C., for example. By maintaining the temperature at the same level for about 10 minutes, for example, after applying the underfill 8, the clearance gap can be filled with the underfill 8 completely owing to the permeability of the underfill 8.

Next, the semiconductor-mounted body, in which the underfill 8 is filled between the multilayer wiring board 4 and the semiconductor chip 2, is put into a baking oven, and heated in a nitrogen atmosphere at a temperature of, for example, 145° C. to 155° C. for, for example, 1 hour. During this heat treatment process, the uncured underfill 8 is cured, and thus the solder bumps 7 are encapsulated. As a result, the bonding portions are protected not only from moisture and external stress but also from compression and shear stress caused by thermal deformation and internal residual stress.

Here, when the heating temperature is lower than 130° C. or when the heating time is shorter than 1 hour, the underfill 8 is not cured sufficiently. As a result, the electric insulation performance is degraded due to entry of moisture, or a sufficient encapsulating effect cannot be obtained, which causes a breakage of the bonding portions when a local stress is applied due to vibration or thermal deformation. Furthermore, when the heating temperature is higher than 170° C. or when the heating time is longer than 3 hours, the underfill 8 develops a curing reaction excessively, which may cause deformation of the multilayer wiring board 4, or breakage or peeling of the bonding portions or the multilayer wiring board 4.

The semiconductor device 1 shown in FIG. 1 can be manufactured by the processes as described above.

In the manufacturing method shown in the above embodiment, the solder bumps 7 are formed on the electrode pads 3 of the semiconductor chip 2. However, the solder bumps 7 may be formed by forming solder bumps on both the electrode pads 3 of the semiconductor chip 2 and on the connection pads 5 of the multilayer wiring board 4 and then bonding these solder bumps.

In the above embodiment, the first insulating layer 41 is made of a thermoplastic resin, but it may be made of the same thermosetting resin as that of the second insulating layer 42. Also in this case, the level difference between the first connection pads 5a and the second connection pads 5b allows the solder bumps 7 connected to the first connection pads 5a to be formed into a more pressed and spread-out shape than the solder bumps 7 connected to the second connection pads 5b. Thus, cracks caused by thermal stress can be prevented from occurring.

Figure 9:
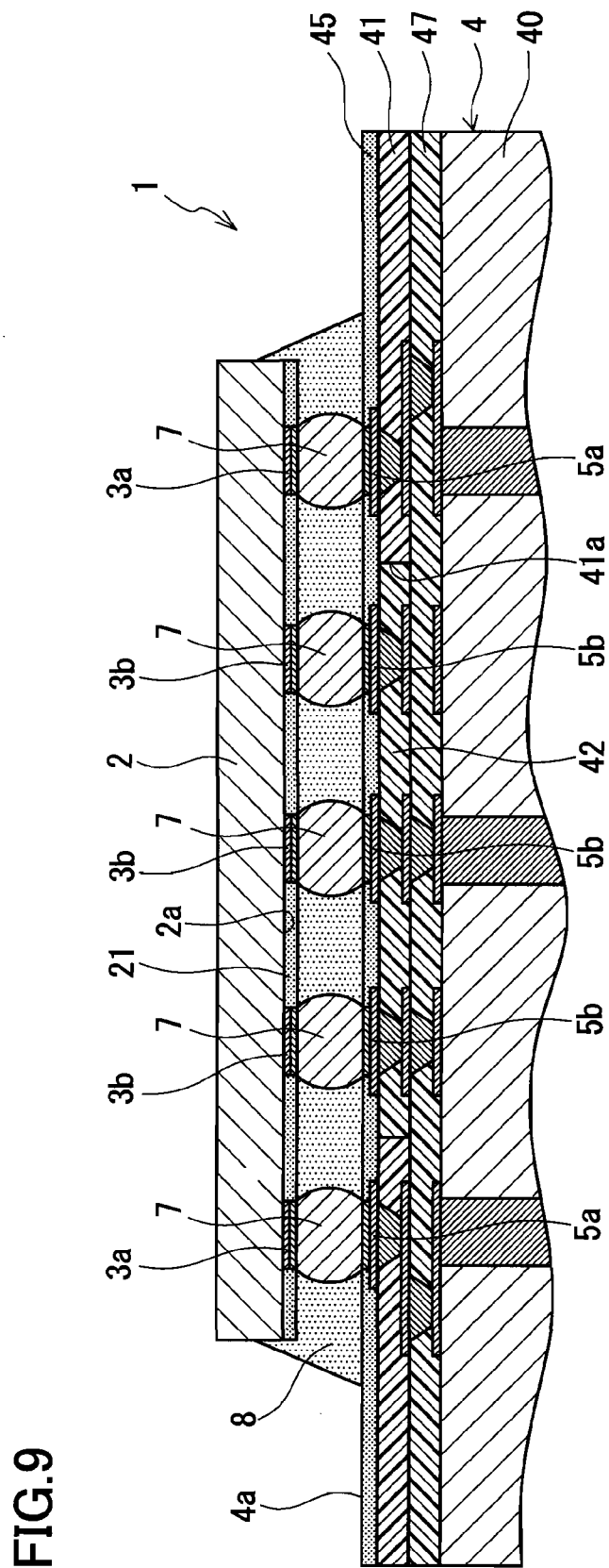
FIG. 9 is a cross-sectional view of a semiconductor device of a modification.

Furthermore, the first insulating layer 41 does not necessarily need to be stacked on the second insulating layer 42. For example, as shown in FIG. 9, the first insulating layer 41 and the second insulating layer 42 may be structured in such a manner that the second insulating layer 42 is fitted in the opening 41a of the first insulating layer 41 and both the first and second insulating layers 41, 42 are stacked on another insulating layer 47 made of a thermosetting resin containing an inorganic filler as described above. That is, the first insulating region for supporting the first connecting pads 5a and the second insulating region for supporting the second connection pads 5b may be on the same plane. Also in this case, the first insulating layer 41 is softened and thus cracks caused by thermal stress can be prevented from occurring.

It should be noted, however, that if the first insulating layer 41 is made of a thermoplastic resin and the first insulating layer 41 is stacked on the second insulating layer 42, as in the above embodiment, the occurrence of cracks can be prevented more effectively by the synergistic effect of these factors.

Figure 10:
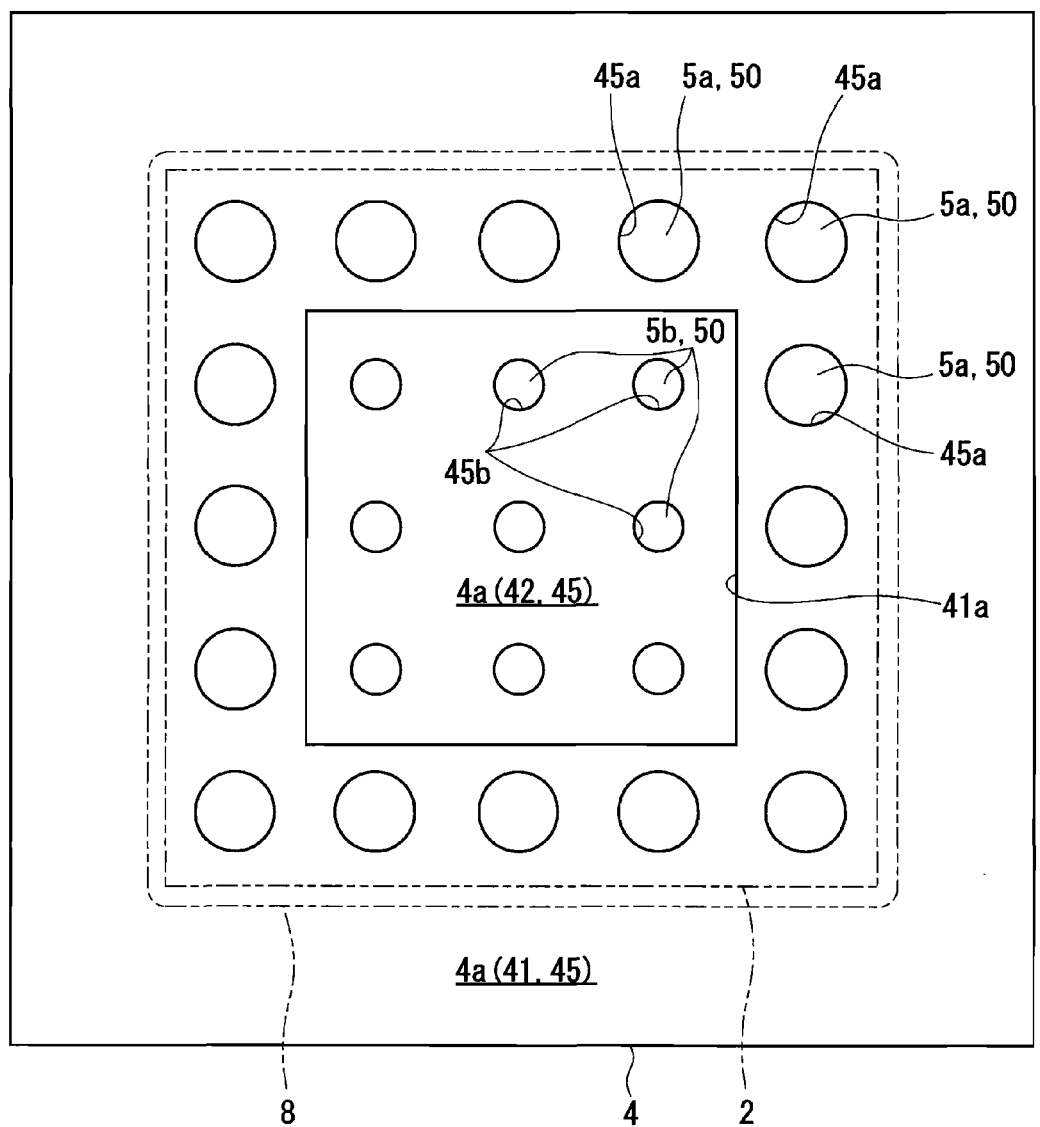
FIG. 10 is a plan view of a semiconductor device of another modification.

Furthermore, in the above embodiment, among the electrode pads 3, electrode pads being respectively disposed in the vicinity of the corners of the back surface 2a of the semiconductor chip 2 serve as the first electrode pads 3a, and the other electrode pads serve as the second electrode pads 3b. However, the first electrode pads 3a only have to include at least the electrode pads 3a disposed in the vicinity of the corners of the back surface 2a of the semiconductor chip 2. In other words, among the connection pads 5, at least the connection pads disposed at the four corners have only to be supported by the first insulating layer 41. For example, among the electrode pads 3, all the electrode pads disposed on the outermost periphery may serve as the first electrode pads 3a, and the electrode pads surrounded by these first electrode pads 3a may serve as the second electrode pads 3b. That is, as shown in FIG. 10, among the connection pads 5, all the connection pads disposed on the outermost periphery may serve as the first connection pads 5a and be supported by the first insulating layer 41. As described above, the shape and size of the opening 41a formed in the first insulating layer 41 can be changed as appropriate according to the arrangement of the first connection pads 5a to be connected to the first electrode pads 3a via the solder bumps 7.

The present invention can be applied also to the case where a wafer-level CSP is mounted on a mounting board. That is, the multilayer wiring board 4 does not necessarily need to be an interposer. For example, the multilayer wiring board 4 may be a two- or three-layer board in which the first insulating layer 41 and the second insulating layer 42 are formed only on the front surface of the core substrate 40.

Furthermore, it goes without saying that, according to the present invention, the same advantageous effects can be obtained even if bumps other than solder bumps, for example, gold bumps, are used.

EXAMPLES

In order to confirm the effects of the present invention, a temperature cycle test was carried out on semiconductor devices of Examples 1 to 3 and Comparative Example as shown below.

Specifically, each of the semiconductor devices was subjected to a pre-treatment for control of moisture absorption under the conditions defined by JEDEC STANDARD TEST METHOD A113-A LEVEL 3. Immediately after the pretreatment, the semiconductor device further was subjected to a pre-treatment in which a solder reflow test was carried out three times at a temperature of 260° C. The semiconductor device thus pre-treated was subjected to a temperature cycle test in which it was left in an environment of a temperature of −55° C. for 30 minutes and then left in an environment of a temperature of 125° C. for 30 minutes per cycle and this cycle was repeated 1000 times and 1500 times, respectively. Changes in the connection resistance values of all the wirings including solder bumps in the semiconductor device were observed.

Example 1

In Example 1, the semiconductor chip 2 of 8.0 mm×8.0 mm was used. The numbers of the electrode pads 3, the connection pads 5, and the solder bumps 7 were 1600 respectively (pad pitch: 180 μm). A glass epoxy substrate was used as the core substrate 40. Polyphenylene ether was used as the thermoplastic resin constituting the first insulating layer 41, and an epoxy resin containing 50 volume % of spherical silica (inorganic filler) having an average particle diameter of 5 μm was used as the thermosetting resin constituting the second insulating layer 42. The thickness of the first insulating layer 41 formed on the top surface was 30 μm, and the thickness of the second insulating layer 42 was 45 μm. As for other conditions (such as the volumes of the solder bumps 7, the shapes and sizes of the electrode pads 3 and the connection pads 5, and the sizes of the openings 45a, 45b), those specifically exemplified in the above embodiment were applied. A semiconductor device was manufactured under the conditions as described above.

As a result of the temperature cycle test, it was found that in the semiconductor device of Example 1, a rate of change in the connection resistance value after the 1000 cycles, which is a criterion for reliability assessment, was +10% or less with respect to the initial resistance value, and a rate of change in the connection resistance value after the 1500 cycles also was +10% or less with respect to the initial resistance value. That is, the semiconductor device of Example 1 had good resistance to repeated temperature changes.

Example 2

A semiconductor device was manufactured under the same conditions as those of Example 1, except that the size of the openings 45a formed at positions corresponding to the first connection pads 5a in the front-side solder resist 45 was changed from 130 μm to 90 μm of the other openings 45b.

As a result of the temperature cycle test, in the semiconductor device of Example 2, a rate of change in the connection resistance value after the 1000 cycles was +10% or less with respect to the initial resistance value. However, after the 1500 cycles, the wirings were disconnected partially. In order to identify the causes of the disconnection, a failure mode and effect analysis was carried out on the semiconductor device after being subjected to the temperature cycle test. As a result of the analysis, cracks were observed in the solder bumps 7 responsible for the disconnected wirings, and these cracks started from the points corresponding to the upper edges of the openings 45a of the front-side solder resist 45a.

Example 3

A semiconductor device was manufactured under the same conditions as those of Example 1, except that the thickness of the first insulating layer 41 was changed to 45 μm so that the first insulating layer 41 had a thickness one half the height of the solder bumps 7 formed between the second electrode pads 3b and the corresponding second connection pads 5b.

As a result of the temperature cycle test, in the semiconductor device of Example 3, a rate of change in the connection resistance value after the 1000 cycles was +10% or less with respect to the initial resistance value. However, after the 1200 cycles, the wirings were disconnected partially. In order to identify the causes of the disconnection, a failure mode and effect analysis was carried out on the semiconductor device after being subjected to the temperature cycle test. As a result, the solder bumps 7 responsible for the disconnected wirings were pressed strongly and deformed, compared with those of Example 1, and cracks were observed along the deformed portions in the solder bumps 7.

Comparative Example

Figure 11:
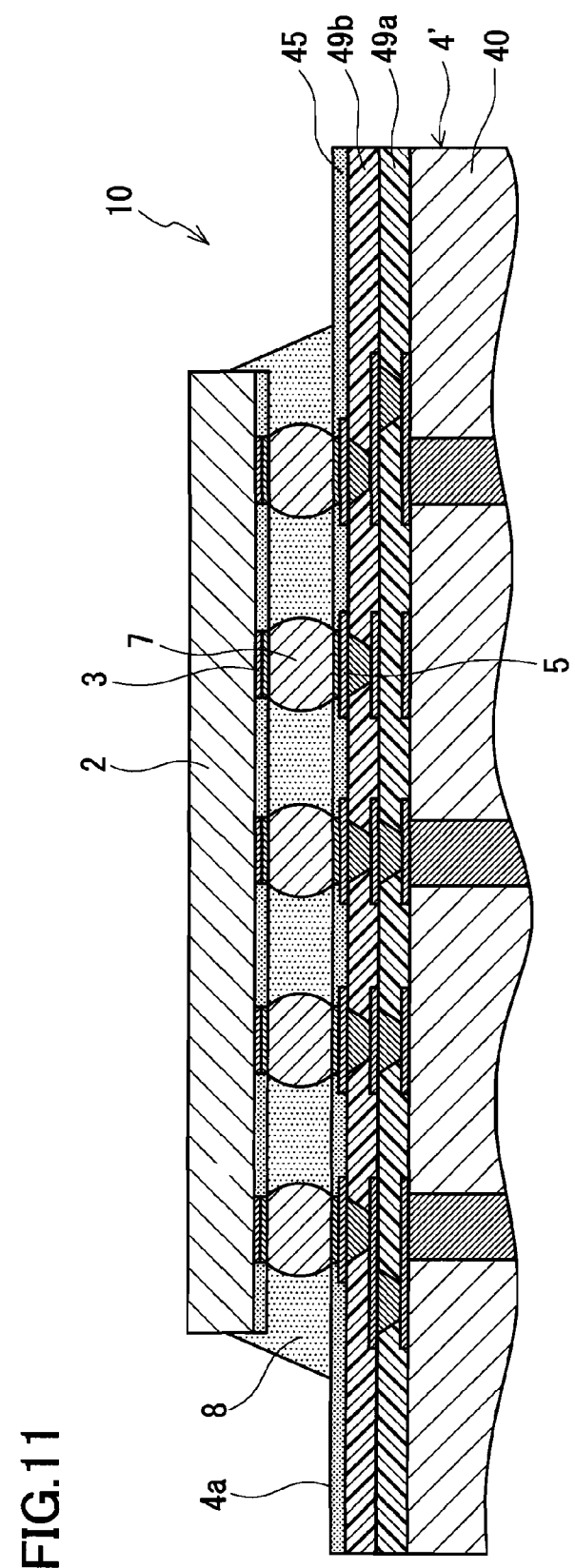
FIG. 11 is a cross-sectional view of a semiconductor device of Comparative Example.

In Comparative Example, a semiconductor device 10 as shown in FIG. 11 was manufactured. A multilayer wiring board 4' of Comparative Example has a structure in which all the connection pads 5 connected to the electrode pads 3 of the semiconductor chip 2 via the solder bumps 7 are formed on the same insulating layer. This multilayer wiring board 4' of Comparative Example was manufactured in the same manner as in the above embodiment up until the formation of an insulating layer 49a corresponding to the second insulating layer. Subsequently, an insulating layer 49b made of the same material (thermosetting resin containing an inorganic filler) as that of the insulating layer 49a was formed on the entire surface of the insulating layer 49a. That is, the insulating layers made of the same material and having the same thickness of 45 μm were formed. Then, the connection pads 5 were formed on the insulating layer 49b. The thickness of the solder resist was 20 μm, and the diameters of the openings for exposing the connection pads 5 were all 90 μm. As for other conditions, those applied in Example 1 also were applied here.

As a result of the temperature cycle test of the semiconductor device 10 of Comparative Example, it was confirmed that a rate of change in the connection resistance value after the 200 cycles exceeds +10% with respect to the initial resistance value, and after the 500 cycles, the wirings were disconnected partially. That is, the semiconductor device 10 had poor resistance to temperature changes.

In order to identify the causes of the disconnection, a failure mode and effect analysis was carried out on the semiconductor device after being subjected to the temperature cycle test. As a result of the analysis, cracks were observed in the aluminum pads of the semiconductor chip around the solder bumps 7 responsible for the disconnected wirings.

The present invention is particularly useful in the case where the size of a semiconductor chip is relatively large and the volume of each solder bump is small.

The invention may be embodied in other forms without departing from the spirit or essential characteristics thereof. The embodiments disclosed in this specification are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device comprising:
   a semiconductor chip having electrode pads formed on a main surface; and
   a multilayer wiring board including a core substrate and wiring layers formed on a chip side of the core substrate, each of the wiring layers including a circuit pattern and an insulating layer, the multilayer wiring board having connection pads formed on a front surface, each of the connecting pads facing a corresponding one of the electrode pads;
   wherein the electrode pads include: first electrode pads including electrode pads respectively disposed in the vicinity of corners of the main surface of the semiconductor chip; and second electrode pads other than the first electrode pads,
   the connection pads include: first connection pads connected to the first electrode pads via bumps; and second connection pads connected to the second electrode pads via bumps,
   the multilayer wiring board includes: a first insulating region for supporting the first connection pads; and a second insulating region for supporting the second connection pads,
   the first insulating region is made of a thermoplastic resin and the second insulating region is made of a thermosetting resin,
   the wiring layers include: a first insulating layer constituting the first insulating region; and a second insulating layer constituting the second insulating region, and the first insulating layer is stacked on the second insulating layer, and
   a thickness of the first insulating layer is at least 1.5 times a thickness of a circuit pattern formed immediately beneath the first insulating layer in the multilayer wiring board, and is not more than one-half of a height of the bumps formed between the second electrode pads and the second connection pads.

2. The semiconductor device according to claim 1, wherein the bumps are all solder bumps having approximately the same volume.

3. The semiconductor device according to claim 1, wherein the thermoplastic resin has a melting point of 280° C. or higher.

4. The semiconductor device according to claim 1, wherein the thermosetting resin contains an inorganic filler.

5. The semiconductor device according to claim 1, wherein an underfill is filled between the multilayer wiring board and the semiconductor chip.

6. The semiconductor device according to claim 1, wherein the multilayer wiring board is an interposer having external connection pads on its a back surface.

7. The semiconductor device according to claim 1, wherein the core substrate contains glass cloth.

8. A semiconductor device comprising:
a semiconductor chip having electrode pads formed on a main surface; and
a multilayer wiring board including a core substrate and wiring layers formed on a chip side of the core substrate, each of the wiring layers including a circuit pattern and an insulating layer, the multilayer wiring board having connection pads formed on a front surface, each of the connecting pads facing a corresponding one of the electrode pads;
wherein the electrode pads include: first electrode pads including electrode pads respectively disposed in the vicinity of corners of the main surface of the semiconductor chip; and second electrode pads other than the first electrode pads,
the connection pads include: first connection pads connected to the first electrode pads via bumps; and second connection pads connected to the second electrode pads via bumps,
the multilayer wiring board includes: a first insulating region for supporting the first connection pads; and a second insulating region for supporting the second connection pads,
the first insulating region is made of a thermoplastic resin and the second insulating region is made of a thermosetting resin,
the wiring layers include: a first insulating layer constituting the first insulating region; and a second insulating layer constituting the second insulating region, and the first insulating layer is stacked on the second insulating layer, and
the multilayer wiring board further includes a solder resist covering the first insulating layer and the second insulating layer but having openings at positions corresponding to the first connection pads and openings at positions corresponding to the second connection pads; and the openings formed at the positions corresponding to the first connection pads are larger in size than the openings formed at the positions corresponding to the second connection pads.

9. The semiconductor device according to claim 8, wherein the bumps are all solder bumps having approximately the same volume.

10. The semiconductor device according to claim 8, wherein the thermoplastic resin has a melting point of 280° C. or higher.

11. The semiconductor device according to claim 8, wherein the thermosetting resin contains an inorganic filler.

12. The semiconductor device according to claim 8, wherein an underfill is filled between the multilayer wiring board and the semiconductor chip.

13. The semiconductor device according to claim 8, wherein the multilayer wiring board is an interposer having external connection pads on a back surface.

14. The semiconductor device according to claim 8, wherein the core substrate contains glass cloth.

* * * * *